United States Patent
Hu et al.

(10) Patent No.: US 12,394,959 B1
(45) Date of Patent: Aug. 19, 2025

(54) CONTINUOUS ELECTRICAL VARIABLE MEASURING APPARATUS FOR POWER DISTRIBUTION CABINET

(71) Applicant: Changshu Institute of Technology, Jiangsu (CN)

(72) Inventors: Chaobin Hu, Jiangsu (CN); Junjun Liu, Jiangsu (CN); Feng Yi, Jiangsu (CN)

(73) Assignee: Changshu Institute of Technology, Suzhou (CN)

( * ) Notice: Subject to any disclaimer, the term of this patent is extended or adjusted under 35 U.S.C. 154(b) by 0 days.

(21) Appl. No.: 19/172,588

(22) Filed: Apr. 7, 2025

(30) Foreign Application Priority Data

May 7, 2024 (CN) .......................... 202410554746.0

(51) Int. Cl.
| | |
|---|---|
| *H05K 7/20* | (2006.01) |
| *G01R 1/02* | (2006.01) |
| *G01R 31/00* | (2006.01) |
| *H02B 1/28* | (2006.01) |
| *H02B 1/32* | (2006.01) |

(52) U.S. Cl.
CPC ................ *H02B 1/32* (2013.01); *G01R 1/02* (2013.01); *G01R 31/00* (2013.01); *H02B 1/28* (2013.01); *H05K 7/20181* (2013.01)

(58) Field of Classification Search
CPC ........ H02B 1/28; H05K 7/20181; G01R 1/02; G01R 1/0408; G01R 31/00
See application file for complete search history.

(56) References Cited

FOREIGN PATENT DOCUMENTS

| CN | 113607979 A | * 11/2021 | ............... G01R 1/02 |
|---|---|---|---|
| CN | 114295870 A | * 4/2022 | |
| CN | 114447796 A | * 5/2022 | ............... H02B 1/46 |

* cited by examiner

*Primary Examiner* — Robert J Hoffberg

(57) ABSTRACT

Disclosed is a continuous electrical variable measuring apparatus for a power distribution cabinet, falling within the technical field of electrical variables of power distribution cabinets. By arranging an arc-shaped cover plate, an electrical variable measuring apparatus body can be completely wrapped together with a protective box, avoiding accidental damage caused by collision with other goods during transportation or storage, thus playing a good protective effect. Moreover, when the apparatus is used, the arc-shaped cover plate can be slid to expose the electrical variable measuring apparatus body, facilitating a worker to perform test operation. The arc-shaped cover plate does not require to be disassembled during use, and the arc-shaped cover plate is still integrated with the protective box, avoiding a situation that the arc-shaped cover plate needs to be separately stored during electrical variable test, thus making the detection process faster and more convenient.

3 Claims, 7 Drawing Sheets

CONTINUOUS ELECTRICAL VARIABLE MEASURING APPARATUS FOR POWER DISTRIBUTION CABINET

CROSS-REFERENCE TO RELATED APPLICATION

This application claims priority of Chinese Patent Application No. 202410554746.0, filed on May 7, 2024, the entire contents of which are incorporated herein by reference.

TECHNICAL FIELD

The present disclosure relates to the technical field of electrical variables of power distribution cabinets, and in particular to a continuous electrical variable measuring apparatus for a power distribution cabinet.

BACKGROUND

At present, traditional electrical variable measuring apparatuses for power distribution cabinets can only measure the electrical variable of a single power distribution cabinet one by one, which results in low efficiency. Therefore, to improve the efficiency and accuracy of real-time monitoring, in the related art, a continuous electrical variable measuring apparatus for a power distribution cabinet is innovatively designed, which can continuously measure the power distribution cabinets, achieve the objective of high efficiency and continuous monitoring, and meet the demand for power system stability and energy efficiency improvement today.

At present, the continuous electrical variable measuring apparatus for a power distribution cabinet has potential safety hazards, including the lack of external protective devices, which makes the apparatus vulnerable to external factors during transportation or storage, especially the display screen, which not only affects the reliability and stability of the apparatus, but also shortens the service life of the apparatus.

Therefore, the present disclosure provides a continuous electrical variable measuring apparatus for power distribution cabinets to solve the above-mentioned problems.

SUMMARY

In response to the deficiencies of the related art, the present disclosure provides a continuous electrical variable measuring apparatus for a power distribution cabinet to solve problems that current continuous electrical variable measuring apparatus for power distribution cabinets lacks external protective devices, resulting in the apparatus being easily damaged by external factors during transportation or storage, thereby easily causing damage to the display screen, and affecting the reliability and stability of the apparatus and the service life.

To achieve the above objective, the present disclosure is achieved by the following technical solutions. A continuous electrical variable measuring apparatus for power distribution cabinets includes a protective box and an electrical variable measuring apparatus body mounted inside the protective box.

Radiator assemblies for accelerating the heat dissipation of the electrical variable measuring apparatus body are fixedly arranged on two sides of inner walls of the protective box, a plurality of air inlets are uniformly disposed on outer walls of the protective box and at positions opposite to the radiator assemblies, and dust-proof assemblies for filtering dust in air are arranged inside the air inlets; track grooves are disposed on two sides of outer walls of the protective box and below the dust-proof assemblies, driving assemblies for driving the dust-proof assemblies and the radiator assemblies to work are slidably arranged inside the track grooves, and an arc-shaped cover plates is fixedly arranged on opposite side walls of the two driving assemblies and above the electrical variable measuring apparatus body; and first strong magnets are fixedly arranged on the outer walls of the protective box, second strong magnets corresponding to positions of the first strong magnets are fixedly arranged on side walls of the driving assemblies, the first strong magnets and the second strong magnets cooperate with each other to jointly complete the limitation of positions of the driving assemblies.

Further, the radiator assemblies include radiator bodies fixedly arranged on inner walls of the protective box, and trigger switches fixedly arranged on outer walls of the radiator bodies for controlling the opening or closing of the radiator bodies.

Further, the dust-proof assemblies include filter plates fixedly arranged inside the air inlets and transmission shafts rotatably arranged inside the filter plates, ends of the transmission shafts are fixedly arranged with gears, and sides of outer walls of the transmission shafts away from the gears are fixedly arranged with brushes for cleaning dust on surfaces of the filter plates.

Further, the driving assemblies include side plates fixedly arranged on side walls of the arc-shaped cover plate via bolts, and arc-shaped racks detachably fixedly arranged on side walls of the side plates and meshed with the gears; and a plurality of guide wheels are fixedly arranged on the side walls of the side plates close to the protective box, the guide wheels are slidably arranged inside the track grooves, arc-shaped guide grooves are disposed on the side walls of the side plates, and spherical projections adapted to positions of the trigger switches are fixedly arranged inside the arc-shaped guide grooves.

Further, the trigger switches are slidably arranged inside the arc-shaped guide grooves, meeting the spherical projections in a sliding process, and the trigger switches are triggered to complete an action of turning on the radiator assemblies or turning off the radiator assemblies.

Further, an outer wall of the protective box is fixedly arranged with a lifting handle for facilitating hand holding, and an outer wall of the lifting handle is fixedly sleeved with a rubber protective sleeve.

Further, the outer walls of the protective box are coated with insulation varnish, the insulation varnish is coated with three layers, and a current layer of insulating varnish is determined to be dry before a previous layer is coated.

Advantageous Effects

The present disclosure provides a continuous electrical variable measuring apparatus for a power distribution cabinet. Compared with the related art, the present disclosure has the following advantageous effects.

1. According to the continuous electrical variable measuring apparatus for power distribution cabinets, by arranging the arc-shaped cover plate, the electrical variable measuring apparatus body can be completely wrapped together with the protective box when the continuous electrical variable measuring apparatus for power distribution cabinets is idle, thereby avoiding accidental damage caused by collision with other goods during transportation or storage, thus playing a good protective effect. Moreover, when the continuous electrical variable measuring apparatus for power distribution cabinets is used, the arc-shaped cover plate can be slid to expose the electrical variable measuring apparatus body, facilitating a worker to perform test operation on the electrical variable measuring apparatus body, the arc-shaped cover plate does not require to be disassembled during use, and the arc-shaped cover plate is still integrated with the protective box, thereby avoiding a situation that the arc-shaped cover plate needs to be separately stored during electrical variable test, thus making the detection process faster and more convenient.

2. According to the continuous electrical variable measuring apparatus for power distribution cabinets, by arranging the dust-proof assemblies, the air blown outside the electrical variable measuring apparatus body can be filtered when radiators work, thereby maintaining the cleanness of heat dissipation air, and avoiding a situation that dust enters the electrical variable measuring apparatus body with the heat dissipation air and affects the working of the electrical variable measuring apparatus body. Moreover, the dust-proof assemblies have a self-cleaning function, the arc-shaped racks drive the gears to rotate when the arc-shaped cover plate is opened, thereby achieving the effect of brushes cleaning the filter plates; and no separate power device is needed for cleaning the dust-proof assemblies, which saves the manufacturing cost, and at the same time makes the structure simpler and convenient for subsequent overhaul and maintenance.

3. According to the continuous electrical variable measuring apparatus for power distribution cabinets, by arranging the radiator assemblies, the trigger switches are pushed by the spherical projections using a process of opening the arc-shaped cover plate, thereby achieving the objective of automatically opening the radiator assemblies; the trigger switches are pushed again by the spherical projections in a process of closing the arc-shaped cover plate, thereby achieving the objective of closing the radiator assemblies; and the radiator assemblies are opened or closed without manual operation, it is linked with the opening and closing of the arc-shaped cover plate, making the operation of the electrical variable measuring apparatus body more simple, and reducing the labor intensity of the worker.

Figure 1:
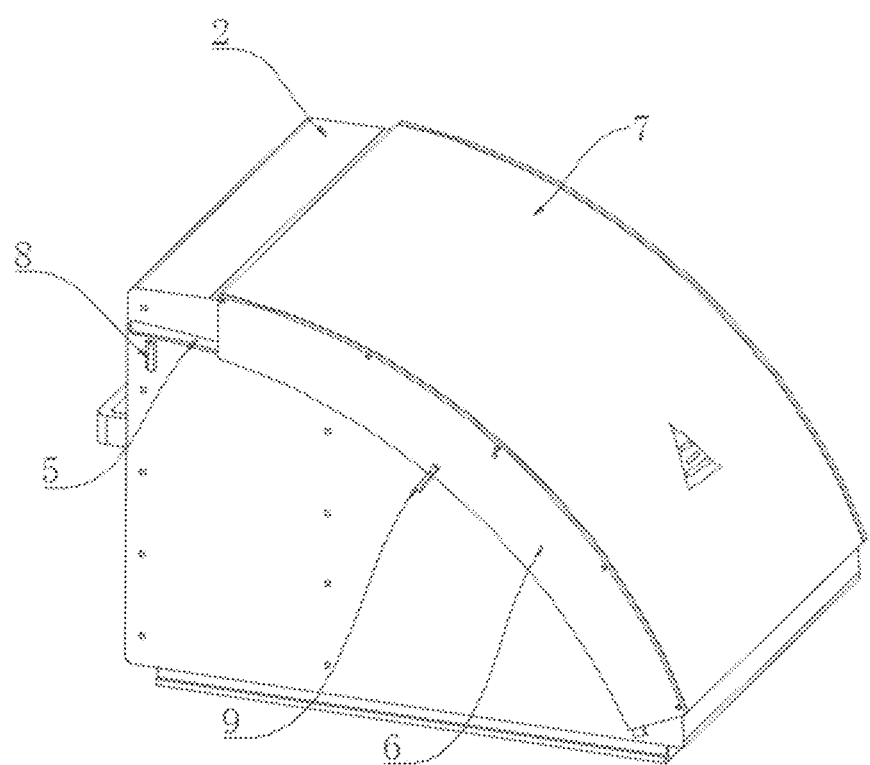
FIG. 1 is a schematic view showing an overall perspective structure according to the present disclosure.

Reference numerals and denotations thereof. 1—electrical variable measuring apparatus body; 2—protective box; 3—radiator assembly; 31—radiator body; 32—trigger switch; 4—dust-proof assembly; 41—filter plate; 42—gear; 43—brush; 5—track groove; 6—driving assembly; 61—side plate; 62—arc-shaped rack; 63—guide wheel; 64—arc-shaped guide groove; 65—spherical projection; 7—arc-shaped cover plate; 8—first strong magnet; and 9—second strong magnet.

DETAILED DESCRIPTION

Technical solutions in the examples of the present disclosure will be described clearly and completely in the following with reference to the accompanying drawings in the examples of the present disclosure. Obviously, all the described examples are only some, rather than all examples of the present disclosure. Based on the examples in the present disclosure, all other examples obtained by those ordinary skilled in the art without creative efforts belong to the scope of protection of the present disclosure.

Figure 2:
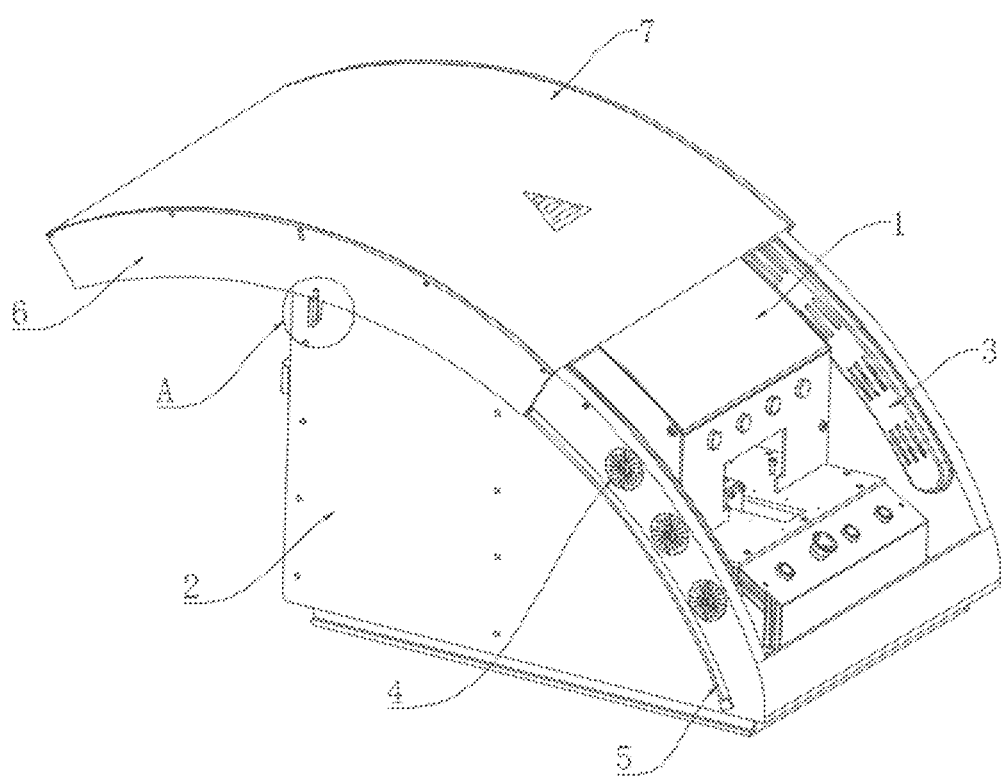
FIG. 2 is a schematic view showing an open state of an arc-shaped cover plate according to the present disclosure.
Figure 3:
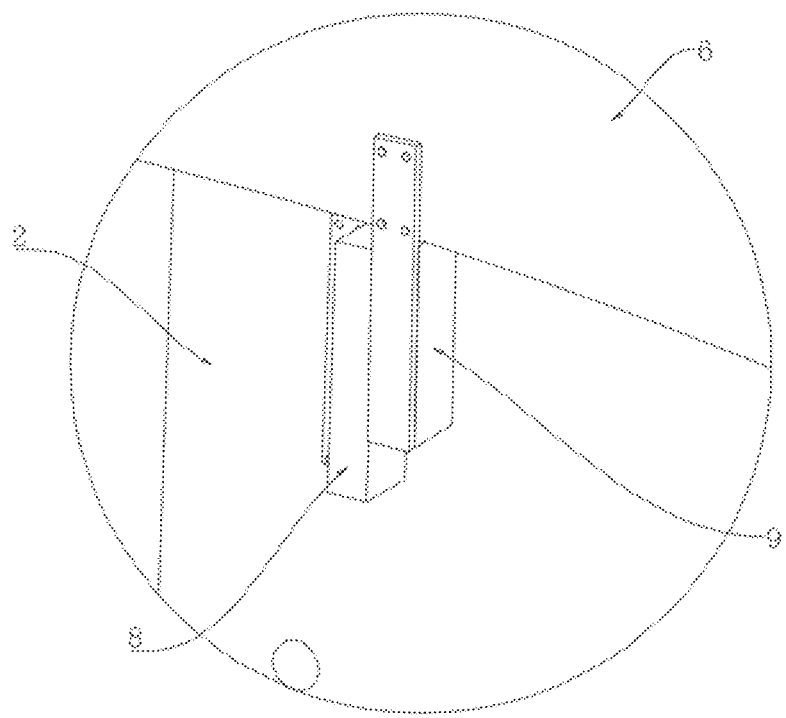
FIG. 3 is an enlargement view of a portion A in FIG. 2 according to the present disclosure.
Figure 4:
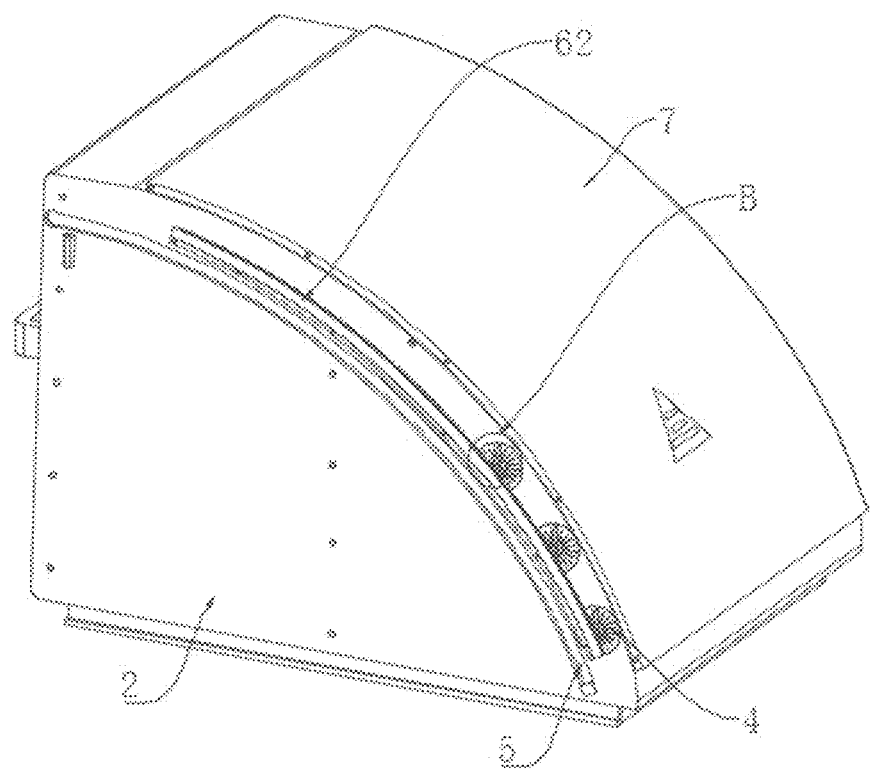
FIG. 4 is a schematic view showing a disassembled state of a driving assembly according to the present disclosure.
Figure 5:
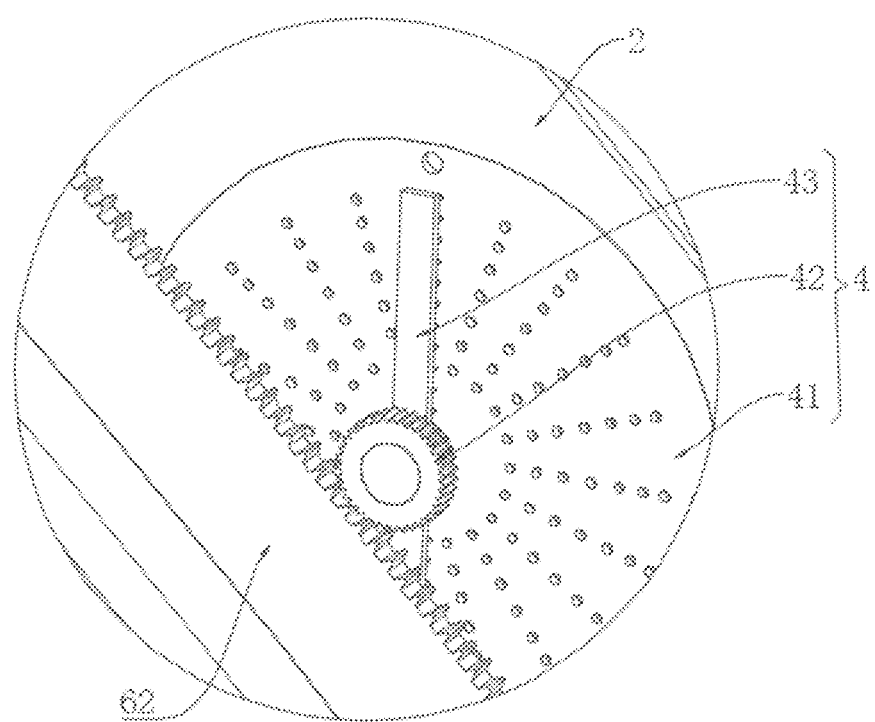
FIG. 5 is an enlargement view of a portion B in FIG. 4 according to the present disclosure.
Figure 6:
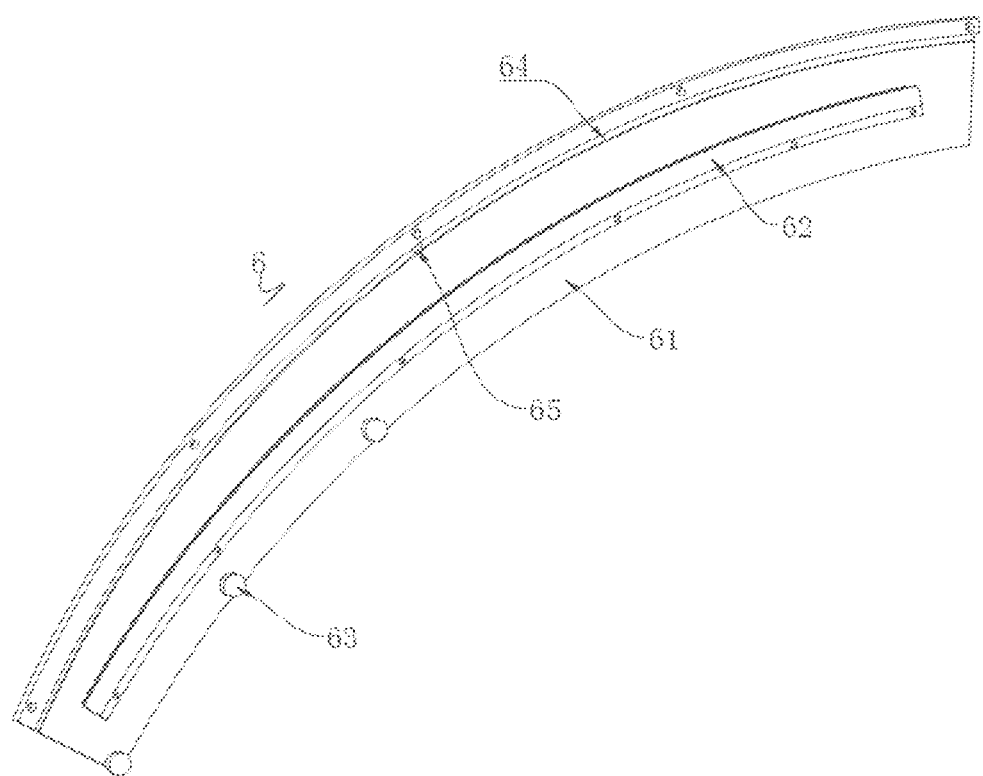
FIG. 6 is a schematic structural view of the driving assembly according to the present disclosure.
Figure 7:
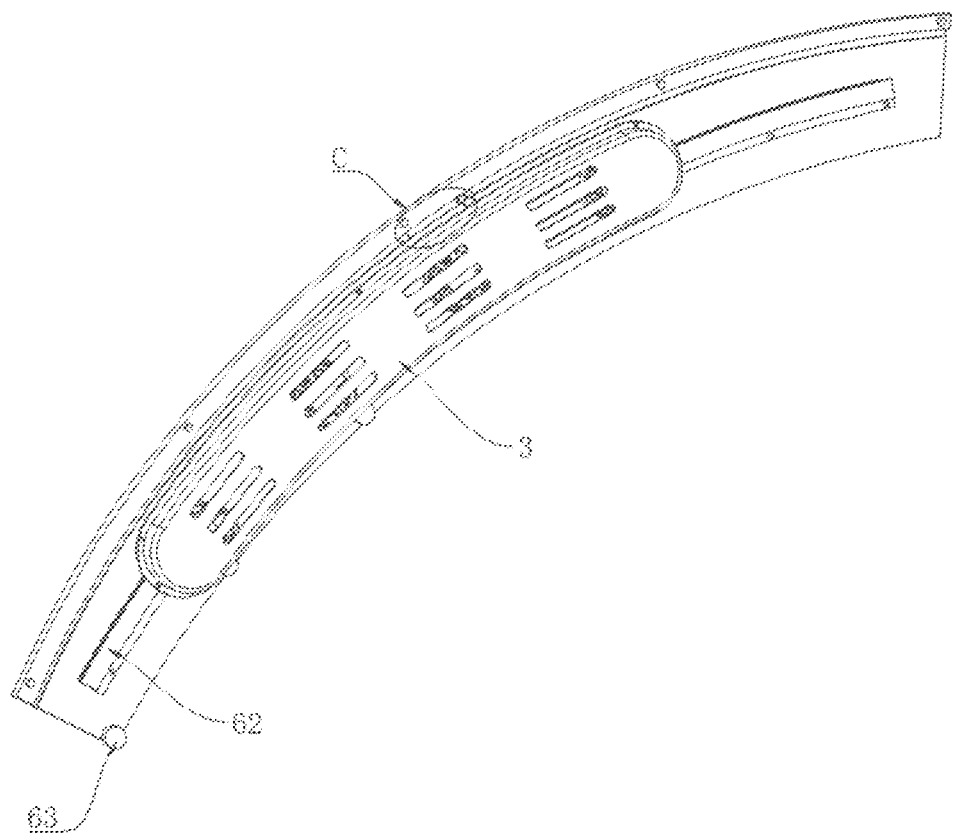
FIG. 7 is a schematic view showing an assembled state of the driving assembly and a radiator assembly according to the present disclosure.
Figure 8:
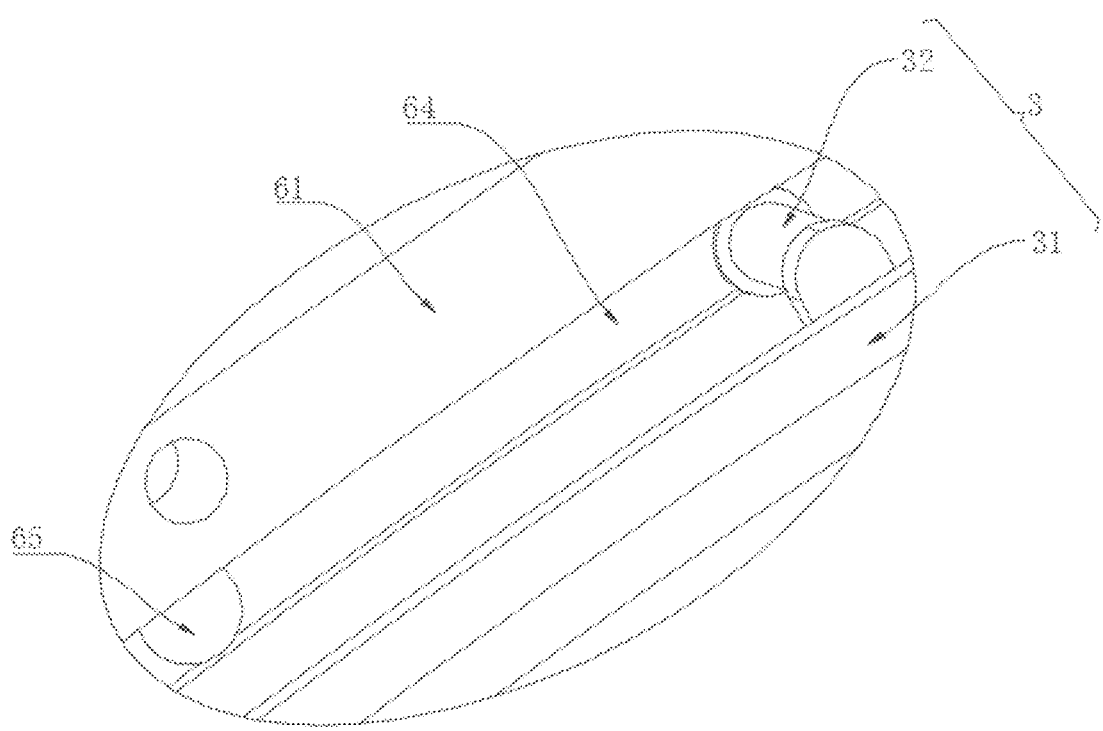
FIG. 8 is an enlargement view of a portion C in FIG. 7 according to the present disclosure.

As shown in FIGS. 1-8, the present disclosure provides two technical solutions. A continuous electrical variable measuring apparatus for power distribution cabinets specifically includes the following examples.

Example 1: a continuous electrical variable measuring apparatus for power distribution cabinets includes a protective box 2 and an electrical variable measuring apparatus body 1 mounted inside the protective box 2. Radiator assemblies 3 for accelerating the heat dissipation of the electrical variable measuring apparatus body 1 are fixedly arranged on two sides of inner walls of the protective box 2, a plurality of air inlets are uniformly disposed on outer walls of the protective box 2 and at positions opposite to the radiator assemblies 3, and dust-proof assemblies 4 for filtering dust in air are arranged inside the air inlets; track grooves 5 are disposed on two sides of outer walls of the protective box 2 and below the dust-proof assemblies 4, driving assemblies 6 for driving the dust-proof assemblies 4 and the radiator assemblies 3 to work are slidably arranged inside the track grooves 5, and an arc-shaped cover plate 7 is fixedly arranged on opposite side walls of the two driving assemblies 6 and above the electrical variable measuring apparatus body 1; the arc-shaped cover plate 7 is made of stainless steel, which has high strength and can play a good protective effect; and first strong magnets 8 are fixedly arranged on the outer walls of the protective box 2, second strong magnets 9 corresponding to positions of the first strong magnets 8 are fixedly arranged on side walls of the driving assemblies 6, the first strong magnets 8 and the second strong magnets 9 cooperate with each other to jointly complete the limitation of positions of the driving assemblies 6. The radiator assemblies 3 include radiator bodies 31 fixedly arranged on inner walls of the protective box 2, and trigger switches 32 fixedly arranged on outer walls of the radiator bodies 31 for controlling the opening or closing of the radiator bodies 31. The trigger switches 32 and the radiator bodies 31 are electrically connected via wires, and when the trigger switches 32 are pushed by external force, circuits where the radiator bodies 31 are located are conducted, and external air can be sucked into the protective box 2 and swept in a direction of the electric variable measuring apparatus body 1, thereby achieving the effect of speeding up the circulation of air around the electric variable measuring apparatus body 1. The air inlets are in communication with interiors of the radiator bodies 31 to ensure that the air can normally enter. The radiator bodies 31 are known in the art, and the inner structure and working principles thereof will not be described in detail here. The dust-proof assemblies 4 include filter plates 41 fixedly arranged inside the air inlets and transmission shafts rotatably arranged inside the filter plates 41, ends of the transmission shafts are fixedly arranged with gears 42, and sides of outer walls of the transmission shafts away from the gears 42 are fixedly arranged with brushes 43 for cleaning dust on surfaces of the filter plates 41. An outer wall of the protective box 2 is fixedly arranged with a lifting handle for facilitating hand holding, and an outer wall of the lifting handle is fixedly sleeved with a rubber protective sleeve. The outer walls of the protective box 2 are coated with insulation varnish, the insulation varnish is coated with three layers, and a current layer of insulating varnish is determined to be dry before a previous layer is coated.

Example 2: the main differences between the present example and the first technical solution are as follows. According to the continuous power distribution cabinet electric variable measurement device, the driving assemblies 6 comprise side plates 61 fixedly arranged on side walls of the arc-shaped cover plate 7 via bolts, and arc-shaped racks 62 detachably fixedly arranged on side walls of the side plates 61 and meshed with the gears 42; and a plurality of guide wheels 63 are fixedly arranged on the side walls of the side plates 61 close to the protective box 2, the guide wheels 63 are slidably arranged inside the track grooves 5, arc-shaped guide grooves 64 are disposed on the side walls of the side plates 61, and spherical projections 65 adapted to positions of the trigger switches 32 are fixedly arranged inside the arc-shaped guide grooves 64. The trigger switches 32 are slidably arranged inside the arc-shaped guide grooves 64, meeting the spherical projections 65 in a sliding process, and the trigger switches 32 are triggered to complete an action of turning on the radiator assemblies 3 or turning off the radiator assemblies 3.

When in use, the continuous electrical variable measuring apparatus for power distribution cabinets is carried to a detection position, the arc-shaped cover plate 7 is manually pushed to slide along the track grooves 5 until the first strong magnets 8 and the second strong magnets 9 meet, the two strong magnets are attracted to each other by magnetic force, the position of the arc-shaped cover plate 7 is limited, and at this time, the electrical variable measuring apparatus body 1 is exposed outside the protective box 2. While the arc-shaped cover plate 7 slides along the track grooves 5, since the arc-shaped racks 62 drive the gears 42 to be engaged and connected, the arc-shaped racks 62 drive the gears 42 to rotate; and since the gears 42 and the brushes 43 are fixedly arranged together on the same transmission shafts, the gears 42 rotate and simultaneously drive the brushes to sweep surfaces of the filter plates 41 until the arc-shaped racks 62 and the gears 42 are disengaged, and the brushes 43 lose power and end the sweeping action. At the same time, when the arc-shaped cover plate 7 slides along the track grooves 5, the spherical projections 65 and the trigger switches 32 meet, the trigger switches 32 are pushed by the spherical projections 65, the circuits where the radiator bodies 31 are located is are conducted, the radiator bodies 31 suck the external air to blow in a direction of the electrical variable measuring apparatus body 1, and the heat generated during the operation of the electrical variable measuring apparatus body 1 is quickly discharged with the flowing air. Furthermore, a worker uses the electric variable measuring apparatus body 1 to measure the electrical variable of an apparatus to be inspected. The electrical variable measuring process is an existing technology, and has been widely used in actual production. Therefore, the detailed operation of the electric variable measuring apparatus body 1 will not be described here. After the electrical variable measuring is finished, the arc-shaped cover plate 7 is manually pushed in an opposite direction again, after the pushing force is greater than the magnetic force between the first strong magnets 8 and the second strong magnets 9, the two magnets are separated, the spherical projections 65 and the trigger switches 32 meet again, the trigger switches 32 are pushed by the spherical projections 65, and the radiator bodies 31 are stopped when the circuits where the radiator bodies 31 are located are disconnected. At the same time, the arc-shaped racks 62 return to a meshing state of the gears 42 again from a separated state, and after the gears 42 rotate, the brushes 43 are synchronously driven to rotate, and the dust on the outer walls of the filter plates 41 is cleaned again.

It is to be noted that in the present disclosure, relational terms including first and second, and the like, may be used herein to distinguish one entity or orientation from another entity or orientation without necessarily requiring or implying any actual such relationship or order between the entities or orientations. Furthermore, the terms "including", "comprising", or any other variations thereof, are intended to cover non-exclusive inclusion, and a process, method, article, or apparatus including a series of elements includes not only those elements, but also other elements not explicitly listed, or elements inherent to such process, method, article, or apparatus.

While examples of the present disclosure have been illustrated and described, those ordinary skilled in the art will understand that various changes, modifications, substitutions and variations can be made to these examples without departing from the principles and spirit of the present disclosure. The scope of the present disclosure is limited to the appended claims and equivalents thereof.

The invention claimed is:

1. A continuous electrical variable measuring apparatus for a power distribution cabinet, comprising a protective box (2) and an electrical variable measuring apparatus body (1) mounted inside the protective box (2), wherein
radiator assemblies (3) for accelerating a heat dissipation of the electrical variable measuring apparatus body (1) are fixedly arranged on two sides of inner walls of the protective box (2), a plurality of air inlets are uniformly disposed on outer walls of the protective box (2) and at positions opposite to the radiator assemblies (3), and dust-proof assemblies (4) for filtering dust in air are arranged inside the air inlets; track grooves (5) are disposed on two sides of the outer walls of the protective box (2) and below the dust-proof assemblies (4), driving assemblies (6) for driving the dust-proof assemblies (4) and the radiator assemblies (3) to work are slidably arranged inside the track grooves (5), and an arc-shaped cover plate (7) is fixedly arranged on opposite side walls of the two driving assemblies (6) and above the electrical variable measuring apparatus body (1); and first magnets (8) are fixedly arranged on the outer walls of the protective box (2), second magnets (9) corresponding to positions of the first magnets (8) are fixedly arranged on the opposite side walls of the driving assemblies (6), the first magnets (8) and the second magnets (9) cooperate with each other to jointly complete the limitation of positions of the driving assemblies (6);
the radiator assemblies (3) comprise radiator bodies (31) fixedly arranged on the inner walls of the protective box (2), and trigger switches (32) fixedly arranged on outer walls of the radiator bodies (31) for controlling opening or closing of the radiator bodies (31);
the dust-proof assemblies (4) comprise filter plates (41) fixedly arranged inside the air inlets and transmission shafts rotatably arranged inside the filter plates (41), ends of the transmission shafts are fixedly arranged with gears (42), and sides of outer walls of the transmission shafts away from the gears (42) are fixedly arranged with brushes (43) for cleaning dust on surfaces of the filter plates (41);

the driving assemblies (6) comprise side plates (61) fixedly arranged on side walls of the arc-shaped cover plate (7) via bolts, and arc-shaped racks (62) detachably fixedly arranged on side walls of the side plates (61) and meshed with the gears (42); and a plurality of guide wheels (63) are fixedly arranged on the side walls of the side plates (61) close to the protective box (2), the guide wheels (63) are slidably arranged inside the track grooves (5), arc-shaped guide grooves (64) are disposed on the side walls of the side plates (61), and spherical projections (65) adapted to positions of the trigger switches (32) are fixedly arranged inside the arc-shaped guide grooves (64); and the trigger switches (32) are slidably arranged inside the arc-shaped guide grooves (64), meeting the spherical projections (65) in a sliding process, and the trigger switches (32) are triggered to complete an action of turning on the radiator assemblies (3) or turning off the radiator assemblies (3).

2. The continuous electrical variable measuring apparatus for a power distribution cabinet according to claim 1, wherein one of the outer walls of the protective box (2) is fixedly arranged with a lifting handle for facilitating hand holding, and an outer wall of the lifting handle is fixedly sleeved with a rubber protective sleeve.

3. The continuous electrical variable measuring apparatus for a power distribution cabinet according to claim 1, wherein the outer walls of the protective box (2) are coated with insulation varnish, the insulation varnish is coated with three layers, and before each of subsequent one of the layers is coated, a previous one of the layers is determined to be in a dry state.

\* \* \* \* \*